United States Patent
Choi et al.

(10) Patent No.: US 9,768,416 B2
(45) Date of Patent: Sep. 19, 2017

(54) ORGANIC LIGHT EMITTING DIODE DISPLAY DEVICE AND DONOR SUBSTRATE

(71) Applicant: Samsung Display Co., Ltd., Yongin-si (KR)

(72) Inventors: Jinbaek Choi, Anyang-si (KR);
Younggil Kwon, Suwon-si (KR);
Yeonhwa Lee, Hwaseong-si (KR);
Joongu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/012,116

(22) Filed: Feb. 1, 2016

(65) Prior Publication Data
US 2016/0233457 A1     Aug. 11, 2016

(30) Foreign Application Priority Data

Feb. 11, 2015   (KR) .................. 10-2015-0020854

(51) Int. Cl.
*H01L 51/52*        (2006.01)
*H01L 51/00*        (2006.01)

(52) U.S. Cl.
CPC ...... *H01L 51/5268* (2013.01); *H01L 51/0013* (2013.01); *H01L 51/0085* (2013.01)

(58) Field of Classification Search
None
See application file for complete search history.

(56) References Cited

U.S. PATENT DOCUMENTS

| | | | |
|---|---|---|---|
| 8,249,409 B2 | 8/2012 | Zhang et al. | |
| 8,492,972 B2* | 7/2013 | Hirakata | H01L 51/5246 313/498 |
| 8,842,144 B2 | 9/2014 | Kim | |
| 2003/0127973 A1* | 7/2003 | Weaver | H01L 51/5268 313/504 |
| 2007/0080342 A1* | 4/2007 | Bold | C07F 15/0033 257/40 |
| 2007/0201056 A1* | 8/2007 | Cok | B82Y 20/00 358/1.9 |
| 2008/0018231 A1* | 1/2008 | Hirakata | H01L 51/5246 313/498 |

(Continued)

FOREIGN PATENT DOCUMENTS

| | | |
|---|---|---|
| KR | 1020120042022 | 5/2012 |
| KR | 1020130007278 | 1/2013 |
| KR | 1020140080851 | 7/2014 |

OTHER PUBLICATIONS

Light Emitting Metal Complexes, downloaded from URL<http://chemicalland21.com/info/LED%20METAL%20COMPLEXES.htm> on Jan. 4, 2017.*

(Continued)

*Primary Examiner* — Joseph Schoenholtz
(74) *Attorney, Agent, or Firm* — H.C. Park & Associates, PLC

(57) ABSTRACT

An OLED display device including a first substrate, a first electrode disposed on the first substrate, an organic light emitting layer disposed on the first electrode, a second electrode disposed on the organic light emitting layer, and an organic dot disposed on the second electrode.

20 Claims, 9 Drawing Sheets

(56) References Cited

U.S. PATENT DOCUMENTS

| | | | | |
|---|---|---|---|---|
| 2008/0054802 A1* | 3/2008 | Cok | ................... | H01L 51/5284 313/506 |
| 2008/0237611 A1* | 10/2008 | Cok | ...................... | B82Y 20/00 257/79 |
| 2009/0104835 A1* | 4/2009 | Aoyama | ............. | H01L 51/0013 445/58 |
| 2011/0209749 A1 | 9/2011 | Yang et al. | | |

OTHER PUBLICATIONS

Nabatova-Gabain, Nataliya, Yoko Wasai, and Taiju Tsuboi, "Spectroscopic Ellipsometry Study of Ir(ppy)3 Organic Light Emitting Diode." Current Applied Physics 6.5 (2006): 833-38.*

Optical constants of ITO captured from URL < http://refractiveindex.info/?shelf=other&book=In2O3-SnO2&page=Moerland> on Jan. 4, 2017.*

Solid Surface Energy Data (SFE) for common polymers, downloaded from URL<http://www.surface-tension.de/solid-surface-energy.htm> on Jan. 5, 2017.*

\* cited by examiner

ORGANIC LIGHT EMITTING DIODE DISPLAY DEVICE AND DONOR SUBSTRATE

CROSS-REFERENCE TO RELATED APPLICATION

This application claims priority from and the benefit of Korean Patent Application No. 10-2015-0020854, filed on Feb. 11, 2015, which is hereby incorporated by reference for all purposes as if fully set forth herein.

BACKGROUND

Field

Exemplary embodiments relate to an organic light emitting diode (OLED) display device including an organic dot and a donor substrate used for manufacturing the OLED display device.

Discussion of the Background

An OLED display device is a self-emission-type display device that displays an image using an OLED emitting light. Unlike a liquid crystal display (LCD), an OLED display device does not require a separate light source or backlight. Because the OLED display device does not require a separate light source, the OLED display device may be relatively thin and light-weighted. Further, an OLED display device has lower power consumption, higher luminance, higher response speed compared to an LCD. However, an OLED display device has poor (or low) light emission efficiency because the OLED display device has a multilayer stacked structure which causes a significant portion of light emitted from a light emitting layer to be lost in the OLED display device due to total internal reflection.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an OLED display device including an organic dot and having improved light emission efficiency.

Exemplary embodiments also provide a donor substrate for manufacturing an OLED display device including an organic dot.

Additional aspects will be set forth in the detailed description which follows, and, in part, will be apparent from the disclosure, or may be learned by practice of the inventive concept.

An exemplary embodiment discloses an OLED display device including a first substrate, a first electrode disposed on the first substrate, an organic light emitting layer disposed on the first electrode, a second electrode disposed on the organic light emitting layer, and an organic dot disposed on the second electrode.

An exemplary embodiment also discloses a donor substrate including a base substrate, a light blocking pattern layer disposed on the base substrate, a thermal insulating layer disposed on the light blocking pattern layer, a light-heat conversion layer disposed on the thermal insulating layer, a low surface tension layer disposed on the light-heat conversion layer, and an organic layer disposed on the low surface tension layer. The light blocking pattern layer includes a transmissive portion and a light blocking portion adjacent to the transmissive portion. The low surface tension layer has a first surface tension lower that is than a second surface tension of the organic layer.

An exemplary embodiment also discloses a method of manufacturing an organic light emitting diode display device including preparing a display substrate by disposing a first electrode, an organic light emitting layer, and a second electrode on a first substrate, preparing a donor substrate by disposing a reflective pattern, a thermal insulating layer, a light-heat conversion layer, a low surface tension layer, and an organic layer on a base substrate, forming an organic agglomerate, from the organic layer, on the low surface tension layer by irradiating light to the donor substrate, disposing the display substrate above the donor substrate such that a second electrode of the display substrate faces the organic layer of the donor substrate and such that the display substrate is spaced apart from the donor substrate, and forming an organic dot by heating the donor substrate such that the organic agglomerate is disposed on the second electrode of the display substrate. The low surface tension layer has a first surface tension lower than a second surface tension of the organic layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate embodiments of the inventive concept, and, together with the description, serve to explain the principles of the inventive concept.

DETAILED DESCRIPTION OF THE ILLUSTRATED EMBODIMENTS

Figure 1:
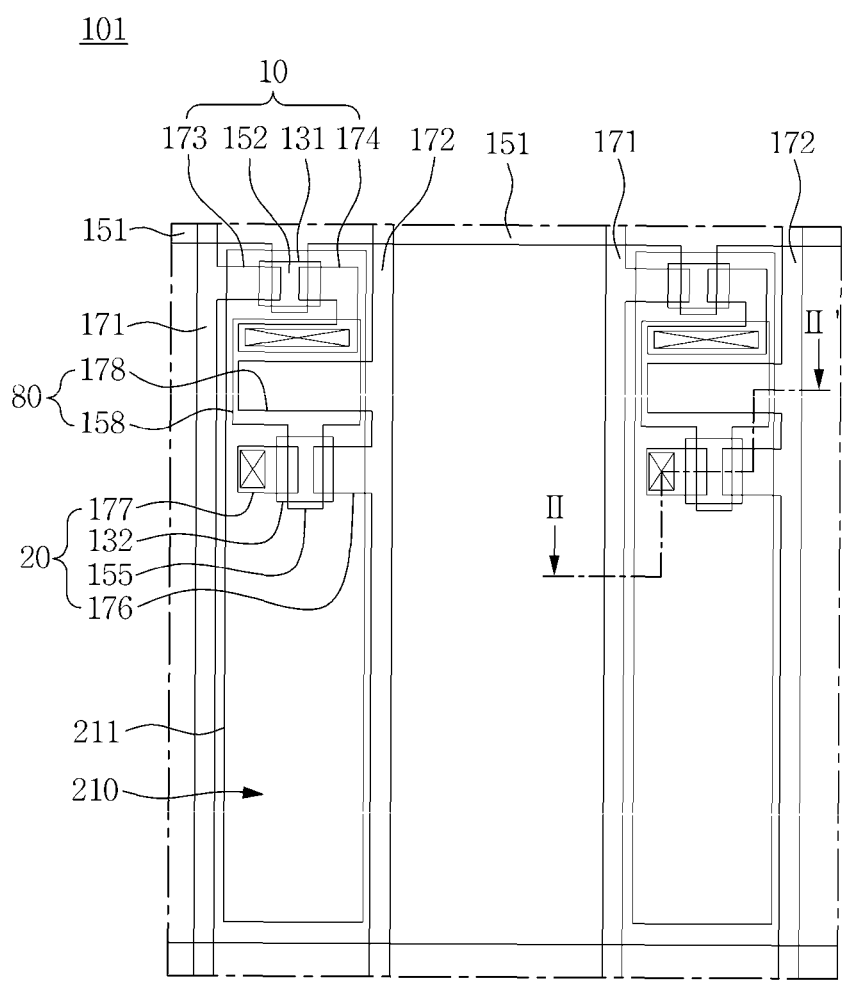
FIG. 1 is a plan view illustrating an OLED display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The terms "disposed" and "disposing" generally mean "placed on" or "placing on" but also include "formed on" and "forming on." For example, a third layer disposed on a first layer is intended to include the third layer being formed separately and then placed on the first layer as well as the third layer being formed on the first layer. The third layer disposed on the first layer is not limited to being placed directly on or being formed directly on the first layer unless specifically stated. Thus, the third layer disposed on or formed on the first layer may have one or more intervening layers (e.g., a second layer) disposed or formed between the third layer and the first layer.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

OLED display devices need higher light emission efficiency. In particular, OLED display devices need to reduce the amount of light lost in a multilayer stacked structure of the OLED display devices from the light emitted from a light emitting layer of the OLED display devices. Thus, in order to improve the light emission efficiency of an OLED display device, exemplary embodiments discussed below reduce the amount of light lost in the OLED display device through internal reflection.

Hereinafter, an exemplary embodiment will be described with reference to FIGS. 1 and 2.

FIG. 1 is a plan view illustrating an OLED display device 101 according to an exemplary embodiment. FIG. 2 is a cross-sectional view taken along sectional line II-II' of FIG. 1.

Figure 2:
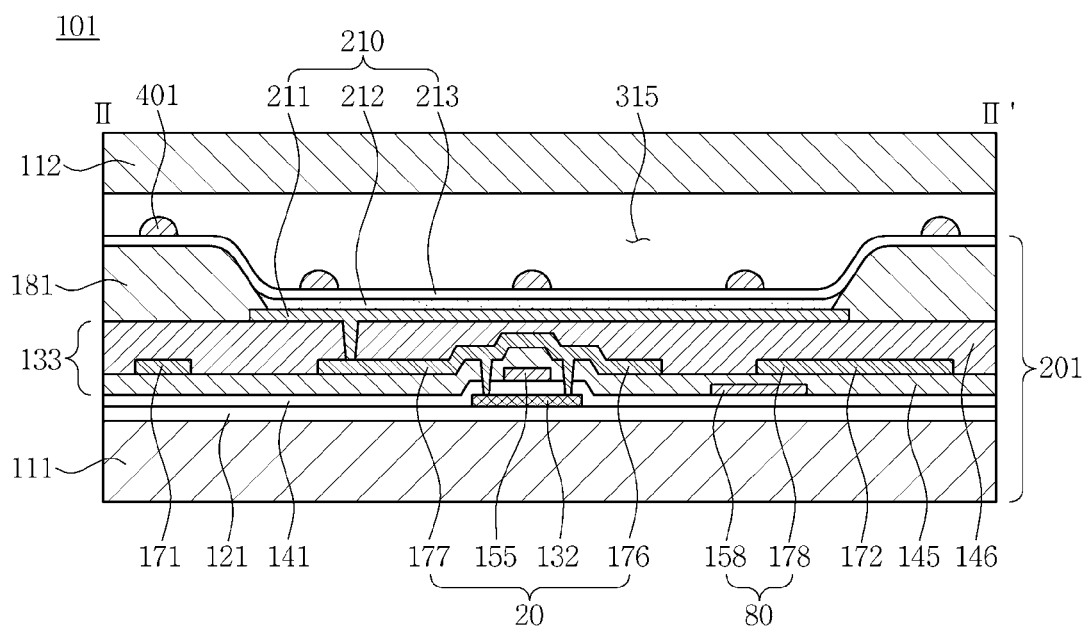
FIG. 2 is a cross-sectional view taken along sectional line II-II' of FIG. 1.

As illustrated in FIGS. 1 and 2, the OLED display device 101 may include a first substrate 111, a wiring unit 133, an OLED 210, an organic dot 401, and a second substrate 112. The first substrate 111, the wiring unit 133, and the OLED 210 may be collectively referred to as an OLED display device 101.

The first substrate 111 may include or may be formed of an insulating material. For example, the first substrate 111 may include at least one of glass, quartz, ceramic, and plastic. However, the first exemplary embodiment is not limited these materials and may include any suitable materials. For example, the first substrate 111 may include or be formed of a metal material, such as stainless steel.

A buffer layer 121 may be disposed on the first substrate 111. The buffer layer 121 may include one or more layers selected from various inorganic layers and organic layers. The buffer layer 121 may reduce or effectively prevent infiltration of undesired elements, such as moisture, into the wiring unit 133 or the OLED 210. The buffer layer 121 may also planarize a surface of the first substrate 111. However, the buffer layer 121 is an optional layer and may be omitted from the OLED display device 101 despite being illustrated in FIG. 2.

The wiring unit 133 may be disposed on the buffer layer 121. The wiring unit 133 may refer to a portion including a switching thin film transistor (TFT) 10, a driving TFT 20, and a capacitor 80, and may drive the OLED 210. The OLED 210 may display an image by emitting light based on a driving signal transmitted from the wiring unit 133.

FIGS. 1 and 2 illustrate an active-matrix-type organic light emitting diode (AMOLED) display device 101 having a 2Tr-1Cap structure that may include two TFTs. For example, the AMOLED display device 101 may have the switching TFT 10 and the driving TFT 20, and the capacitor 80 in each pixel. However, exemplary embodiments are not limited to a display device having a 2Tr-1Cap structure or having two TFTs. For example, the OLED display device 101 may include three or more TFTs and two or more capacitors in each pixel, and may have various structures further including additional wirings. The term "pixel" refers to the smallest unit for displaying an image, and the OLED display device 101 may be configured to display an image using a plurality of pixels.

The switching TFT 10, the driving TFT 20, the capacitor 80, and the OLED 210 may be disposed in each pixel. In addition, a gate line 151 as well as a data line 171 and a common power line 172 insulated from and intersecting the gate line 151 may be disposed in the wiring unit 133. A single pixel may be defined by a boundary among the gate line 151, the data line 171, and the common power line 172, but exemplary embodiments are not limited to this structure. The pixel may be defined by a pixel defining layer (PDL) 181 and/or a black matrix.

The OLED 210 may include a first electrode 211, an organic light emitting layer 212 disposed on the first electrode 211, and a second electrode 213 disposed on the organic light emitting layer 212. A hole and an electron may be injected from the first electrode 211 and the second electrode 213 into the organic light emitting layer 212, respectively, to be combined with one another to form an exciton. The OLED 210 may emit light by energy generated from the exciton falling from an excited state to a ground state.

The capacitor 80 may include a first storage electrode 158 and a second storage electrode 178 with an insulating interlayer 145 interposed between the first and second storage electrodes 158 and 178. The insulating interlayer 145 may include a dielectric material. Capacitance of the capacitor 80 may be determined by electric charges accumulated in the capacitor 80 and voltage across the first storage electrode 158 and the second storage electrode 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. The semiconductor layers 131 and 132 and the gate electrodes 152 and 155 may be insulated from a gate insulating layer 141.

The switching TFT 10 may be configured as a switching element that selects a pixel to perform light emission. The switching gate electrode 152 may be connected to the gate line 151. The switching source electrode 173 may be connected to the data line 171. The switching drain electrode 174 may be spaced apart from the switching source electrode 173 and may be connected to at least one of the first and second storage electrodes 158 and 178. For example, the switching drain electrode 174 may be directly connected to the first storage electrode 158.

The first electrode 211 may serve as a pixel electrode. The driving TFT 20 may be configured to apply a driving power to the first electrode 211 so that the organic light emitting layer 212 of the OLED 210 in a selected pixel emits light. The driving gate electrode 155 may be connected to the first storage electrode 158. The first storage electrode 158 may be connected to the switching drain electrode 174. Thus, the driving gate electrode 155 may be connected to the switching drain electrode 174 through the first storage electrode 158. Each of the driving source electrode 176 and the second storage electrode 178 may be connected to the common power line 172. The driving drain electrode 177 may be connected to the first electrode 211 of the OLED 210 through a contact hole.

The switching TFT 10 may be operated by a gate voltage applied to the gate line 151. The switching TFT 10 may be configured to transmit a data voltage that is applied to the data line 171 to the driving TFT 20. Voltage equivalent to a difference between a common voltage applied from the common power line 172 to the driving TFT 20 and the data voltage transmitted from the switching TFT 10 may be stored in the capacitor 80. Current corresponding to the voltage stored in the capacitor 80 may flow to the OLED 210 through the driving TFT 20 such that the OLED 210 may emit light.

A planarization layer 146 may be disposed on the insulating interlayer 145. The planarization layer 146 may include or be formed of an insulating material and may protect the wiring unit 133. The planarization layer 146 and the insulating interlayer 145 may include or may be formed of the same material.

The driving drain electrode 177 of the driving TFT 20 may be connected to the first electrode 211 of the OLED 210 through the contact hole formed in the planarization layer 146.

In an exemplary embodiment, the first electrode 211 may be a reflective electrode and the second electrode 213 may be a transflective electrode. Accordingly, light generated in the organic light emitting layer 212 may be transmitted through the second electrode 213 to be emitted. In other words, the OLED display device 101 according to an exemplary embodiment is a top-emission-type structure.

The reflective electrode and the transflective electrode may include the same or similar materials. Specifically, the reflective electrode and the transflective electrode may include a metal and/or an alloy. In this regard, whether an electrode is a reflective type or a transflective type may be determined based on a thickness of the electrode. In general, the transflective layer has a thickness of 200 nm or less. As the thickness of the transflective layer decreases, a level of light transmittance may increase, and as the thickness thereof increases, the light transmittance may decrease.

The reflective electrode may include a metal and/or an alloy. For example, the reflective electrode may include at least one of magnesium (Mg), silver (Ag), gold (Au), calcium (Ca), lithium (Li), chromium (Cr), aluminum (Al), and copper (Cu). As another example, the reflective electrode may include an alloy of at least one of magnesium (Mg), silver (Ag), gold (Au), calcium (Ca), lithium (Li), chromium (Cr), aluminum (Al), and copper (Cu). Similarly, the transflective electrode may include a metal and/or an allow. For example, the transflective electrode may include at least one of magnesium (Mg), silver (Ag), gold (Au), calcium (Ca), lithium (Li), chromium (Cr), aluminum (Al), and copper (Cu). As another example, the transflective electrode may include an alloy of at least one of magnesium (Mg), silver (Ag), gold (Au), calcium (Ca), lithium (Li), chromium (Cr), aluminum (Al), and copper (Cu).

The first electrode 211 may include a reflective layer. The reflective layer may include a metal. For example, the reflective layer may include at least one of magnesium (Mg), silver (Ag), gold (Au), calcium (Ca), lithium (Li), chromium (Cr), aluminum (Al), and copper (Cu). As another example, the reflective layer may include at least one of magnesium (Mg), silver (Ag), gold (Au), calcium (Ca), lithium (Li), chromium (Cr), aluminum (Al), and copper (Cu).

The first electrode 211 may also include a transparent conductive layer disposed on the reflective layer. The transparent conductive layer may include a transparent conductive oxide (TCO). The transparent conductive layer may include at least one of indium tin oxide (ITO), indium zinc oxide (IZO), zinc oxide (ZnO), aluminum zinc oxide (AZO), and indium oxide ($In_2O_3$). Because the transparent conductive layer may have a relatively high work function, hole injection through the first electrode 211 may be readily performed.

The first electrode 211 may have a triple-layer structure in which a transparent conductive layer, a reflective layer, and a transparent conductive layer are sequentially stacked.

The second electrode 213 may include a transflective layer including a metal. The transflective layer may include at least one of magnesium (Mg), silver (Ag), gold (Au), calcium (Ca), lithium (Li), chromium (Cr), aluminum (Al), and copper (Cu). The transflective layer may include an alloy of at least one of magnesium (Mg), silver (Ag), gold (Au), calcium (Ca), lithium (Li), chromium (Cr), aluminum (Al), and copper (Cu).

Although not illustrated, at least one of a hole injection layer (HIL) and a hole transporting layer (HTL) may further be disposed between the first electrode 211 and the organic light emitting layer 212. In addition, at least one of an electron transporting layer (ETL) and an electron injection layer (EIL) may further be disposed between the organic light emitting layer 212 and the second electrode 213.

The organic light emitting layer 212, the HIL, the HTL, the ETL, and the EIL may be collectively referred to as an organic layer. Such an organic layer may include or be formed of a low molecular weight organic material and/or a high molecular weight organic material.

The pixel defining layer PDL 181 may have an aperture. The aperture of the pixel defining layer PDL 181 may expose a portion of the first electrode 211. The first electrode 211, the organic light emitting layer 212, and the second electrode 213 may be sequentially stacked in the aperture of the pixel defining layer PDL 181. The second electrode 213 may be disposed on the organic light emitting layer 212 and on the pixel defining layer PDL 181. The pixel defining layer PDL 181 may define a light emission area of the OLED display device 101.

The organic dot 401 may be disposed on the second electrode 213. The organic dot 401 may scatter light to improve light extraction efficiency of the OLED display device 101.

The second substrate 112 may be spaced apart from the organic dot 401 to be disposed above the OLED 210. The second substrate 112 may be a transparent insulting substrate. The second substrate 112 may include or may be formed of at least one of glass, quartz, ceramic, and plastic. The second substrate 112 may be sealingly attached to the first substrate 111 to cover the OLED 210 and to protect the OLED 210. In order to seal the second substrate 112 and the first substrate 111, a sealant (not illustrated) may be disposed on edge portions of the first substrate 111 and the second substrate 112.

An air layer may be disposed in a space between the second substrate 112 and the OLED 210, and alternatively, an inert gas layer may be disposed therein. The OLED display device 101 according to an exemplary embodiment includes an inert gas layer 315 in the space between the second substrate 112 and the OLED 210. An inert gas injected to the inert gas layer 315 may include nitrogen ($N_2$). The inert gas layer 315 may have a low refractive index in a range of about 1.0 to about 1.1, which is similar to a refractive index of air.

Light generated in the organic light emitting layer 212 may be transmitted through various layers constituting the OLED display device 101 and subsequently, may be externally emitted through the second electrode 213. Because refractive indices of the respective layers constituting the OLED display device 101 may differ from one another, light may be refracted or reflected at an interfacial surface between the layers. In particular, when light generated in the organic light emitting layer 212 is externally emitted, a considerable amount of light may be dissipated while being repeatedly reflected from the interfacial surface between adjacent layers. Alternatively, instead of a portion of the light emitted from the organic light emitting layer 212 being dissipated by repeated reflection, all light generated in the organic light emitting layer 212 may be dissipated by total internal reflection. When light is totally reflected, the interfacial surface between the layers serves as a wave guide, and the light may propagate along the interfacial surface and be dissipated.

A material that may disturb a propagation path of light (i.e., a light scattering material) may be disposed at the interfacial surface where the wave guide is formed. The light scattering material may disturb the lightpath of light generated in the organic light emitting layer 212. Thus, light propagating along the interfacial surface may be emitted externally.

The wave guide may be disposed or may be formed at an interfacial surface between an upper surface of the second electrode 213 and the inert gas layer 315. In an exemplary embodiment, the organic dot 401 on the second electrode 213 may disturb the lightpath of light propagating along the wave guide such that the light that is totally reflected to propagate along the interfacial surface may be emitted externally. Therefore, total internal reflection or total-reflection effects may be prevented. Accordingly, light emission efficiency of the OLED display device 101 may be improved.

In order to improve light emission efficiency, the organic dot 401 may have a refractive index that is different from a refractive index of the second electrode 213 as well as a refractive index that is different from a refractive index of the inert gas layer 315. For example, the refractive index of the organic dot 401 may be higher than the refractive index of the inert gas layer 315 and lower than the refractive index of the second electrode 213. However, the exemplary embodiments are not limited to the refractive index of the organic dot 401 being higher than the refractive index of the inert gas layer 315 and lower than the refractive index of the second electrode 213. For example, the organic dot 401 may have a refractive index higher than the refractive index of the second electrode 213.

As a difference in refractive index between the organic dot 401 and the second electrode 213, light-path conversion effects, total-reflection prevention effects, and light scattering effects may increase. Similarly, as a difference between the organic dot 401 and the inert gas layer 315 increases, light-path conversion effects, total-reflection prevention effects, and light scattering effects may increase The organic dot 401 and the inert gas layer 315 may have a refractive-index difference of about 0.1 or more. The organic dot 401 and the second electrode 213 may also have a refractive-index difference of about 0.1 or more. For example, where the organic dot 401 has a first refractive index and the second electrode 213 has a second refractive index, the absolute value of the difference of the first refractive index and the second refractive index is greater than or equal to 0.1. In other words, Formula I must be satisfied in an exemplary embodiment:

|first refractive index−second refractive index|≥0.1   (I)

In an exemplary embodiment, the inert gas layer 315 has a refractive index ranging from about 1 to about 1.1, the second electrode 213 has a refractive index ranging from about 1.5 to about 2.7, and the organic dot 401 has a refractive index ranging from about 1.3 to about 2.6. However, the organic dot 401 may have a refractive index of about 2.7 or more.

The organic dot 401 may be formed through deposition of an organic material using a donor substrate. The donor substrate for forming the organic dot and the method of forming the organic dot will be described below.

The organic dot 401 may have a diameter ranging from about 0.5 μm to about 5 μm and may have a height ranging from about 0.1 μm to about 5 μm. However, the exemplary embodiments are not limited these specified diameter and height ranges. The diameter and the height of the organic dot 401 may vary based on the size and purpose of use of the OLED display device 101. For example, the organic dot 401 may have a diameter and a height more than 5 μm.

The organic dot 401 may be formed of an organic material. The organic material may have a relatively low evaporation point. The organic dot 401 may include an organic material having an evaporation point at a temperature ranging from about 80° C. to about 430° C. For example, the organic dot 401 may include at least one of tris(8-hydroxy-quinolinato) aluminum (Alq$_3$), 4,4'-bis(carbazol-9-yl)biphenyl (CBP), tris(2-phenylpyridine)-iridium (III) (Ir(ppy)$_3$). However, the organic dot 401 is not limited to Alq$_3$, CBP, and Ir(ppy)$_3$. The organic dot 401 may include any suitable materia.

Figure 3:
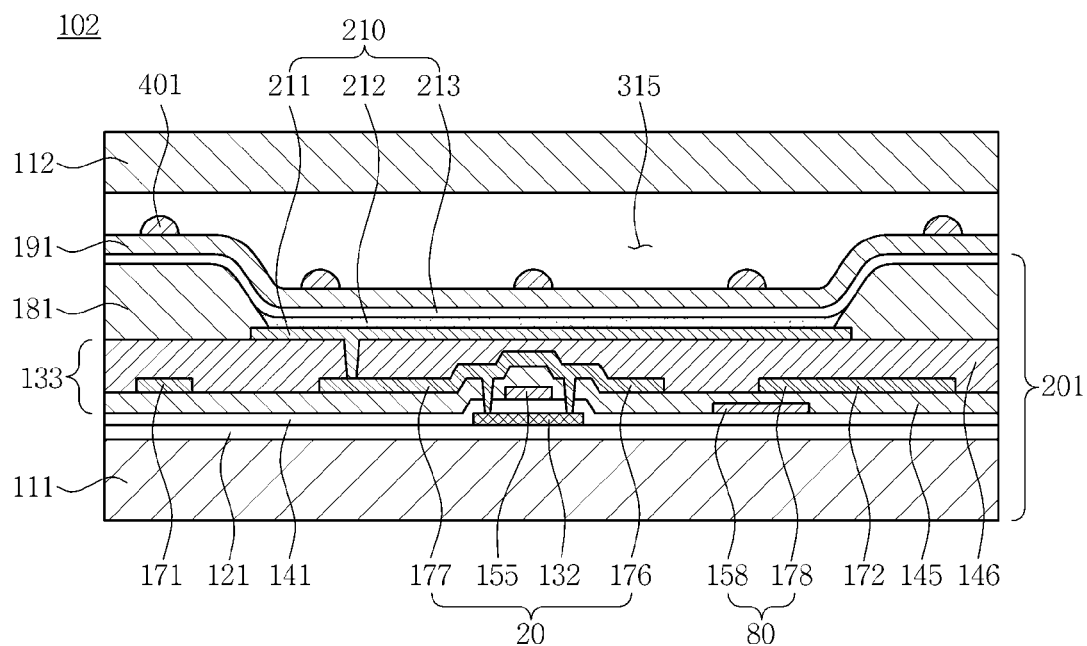
FIG. 3 is a cross-sectional view illustrating an OLED display device according to an exemplary embodiment.

FIG. 3 is a cross-sectional view illustrating an OLED display device 102 according to a second exemplary embodiment. Hereinafter, in order to avoid repetition, detailed descriptions with regard to the configurations described above will be omitted for brevity. In other words, the differences between FIGS. 2 and 3 will be described below.

The OLED display device 102 of FIG. 3 may have the same configuration and elements as the OLED display device 101 of FIGS. 1 and 2, except that the OLED display device 102 of FIG. 3 may include a capping layer 191 disposed on a second electrode 213 such that the capping layer 191 is interposed between the second electrode 213 and the organic dot 401. Thus, the organic dot 401 may be disposed on the capping layer 191.

The capping layer 191 may include or may be formed of at least one of an inorganic material and an organic material. The capping layer 191 may have light transmitting characteristics. The capping layer 191 may include or may be formed of a high molecular weight material and/or a low molecular weight material.

The low molecular weight material may have a refractive index ranging from about 1.3 to about 1.8. The low molecular weight material may include an inorganic material. For example, the inorganic low molecular weight material may include at least one of silicon oxide and magnesium fluoride. The low molecular weight material may include an organic material. The organic low molecular weight material may include at least one of acrylic, polyimide, and polyamide. However, the low molecular weight material may include any suitable material and is not limited to the inorganic and organic materials listed.

The high molecular weight material may have a refractive index ranging from about 1.8 to about 2.7. The high molecular weight material may include an inorganic material. The inorganic high molecular weight material may include at least one of zinc oxide, titanium oxide, zirconium oxide, niobium oxide, tantalum oxide, tin oxide, nickel oxide, silicon nitride, indium nitride, and gallium nitride. The high molecular weight material may include an organic material. The organic high molecular weight material may include at least one of poly(3,4-ethylenedioxythiophene) (PEDOT), 4,4'-bis[N-(3-methylphenyl-N-phenylamino]biphenyl (TPD), 4,4',4''-tris[(3-methylphenyl) phenylamino]triphenylamine (m-MTDATA), 1,3,5-tris[N,N-bis(2-methylphenyl-amino]-benzene (o-MTDAB), 1,3,5-tris[N,N-bis(3-methylphenyl-amino]-benzene (m-MTDAB), 1,3,5-tris[N,N-bis(4-methylphenyl)-amino]-benzene (p-MTDAB), 4,4'-bis[N,N-bis(3-methylphenyl)-amino]-diphenylmethane (BPPM), 4,4'-bis(carbazol-9-yl)biphenyl (CBP), 4,4',4''-tris (N-carbazole) triphenylamine (TCTA), 2,2',2''-(1,3,5-benzentolyl)tris-[1-phenyl-1H-benzoimidazol] (TPBI), and 3-(4-biphenyl)-4-phenyl-5-t-butylphenyl-1,2,4-triazole (TAZ).

The capping layer 191 may have a thickness ranging from about 80 nm or more. For example, the capping layer 191 may have a thickness ranging from about 80 nm to about 500 nm. As another example, the capping layer 191 may have a thickness ranging from about 500 nm to about 900 nm. As a further example, the capping layer 191 may have a thickness of more than 900 nm. The capping layer 191 may be manufactured by any suitable process. For example, the capping layer 191 may be manufactured through deposition.

The organic dot 401 may be disposed on the capping layer 191. In an exemplary embodiment, a refractive-index difference between the organic dot 401 and the capping layer 191 is about 0.1 or more. For example, where the organic dot 401 has a first refractive index and the capping layer 191 has a third refractive index, the absolute value of the difference of the first refractive index and the third refractive index is greater than or equal to 0.1. In other words, Formula II must be satisfied in an exemplary embodiment:

|first refractive index−third refractive index|≥0.1   (II)

The refractive index of the organic dot 401 may be lower than or higher than that of the capping layer 191. The organic material for forming the organic dot 401 may be selected based on the refractive index of the capping layer 191. The organic dot 401 may be formed of an organic material of which a refractive index difference with respect to the refractive index of the capping layer 191 may be about 0.1 or more.

The second substrate 112 may be disposed on the capping layer 191 while being spaced apart from the capping layer 191.

Figure 4:
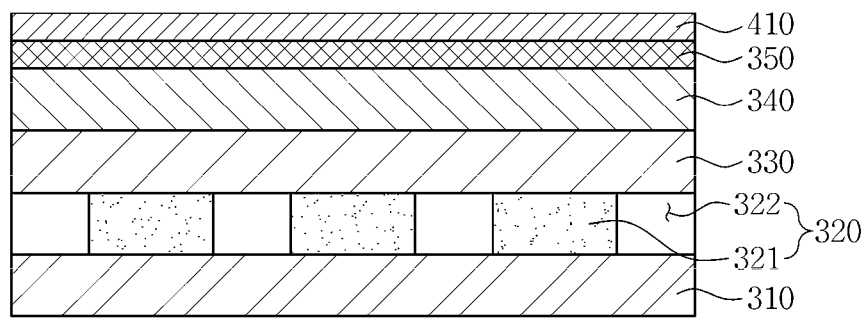
FIG. 4 is a cross-sectional view illustrating a donor substrate according to an exemplary embodiment.

Hereinafter, an exemplary embodiment will be described with reference to FIG. 4. FIG. 4 is a cross-sectional view illustrating a donor substrate 103 according an exemplary embodiment.

Referring to FIG. 4, the donor substrate 103 may include a base substrate 310, a light blocking pattern layer 320, a thermal insulating layer 330, a light-heat conversion layer 340, a low surface tension layer 350, and an organic layer 410.

The base substrate 310 may include or may be formed of a transparent material. The transparent material for the base substrate 310 may be at least one of glass, quartz, ceramic, and plastic. The base substrate 310 may have flexibility, but in some exemplary embodiments, the base substrate 310 may not have flexibility.

The light blocking pattern layer 320 may be disposed on the base substrate 310.

The light blocking pattern layer 320 may have a transmissive portion 322 and may have a light blocking portion 321 adjacent to the transmissive portion 322. The light blocking pattern layer 320 may have a structure in which the transmissive portion 322 and the light blocking portion 321 are alternately disposed. Due to the light blocking pattern layer 320, selective light irradiation may be performed.

The light blocking portion 321 may block light. The light blocking portion 321 may include a reflective layer. The reflective layer of the light blocking portion 321 may include a metal layer. As the reflective layer reflects light, the light blocking portion 321 may be prevented from being heated by the absorbtion of light.

The transmissive portion 322 refers to a portion through which light may be transmitted.

Light irradiated to the base substrate 310 may propagate through the transmissive portion 322 and not propagate through the light blocking portion 321. Accordingly, only a portion of the light-heat conversion layer 340 above the transmissive portion 322 may be selectively heated. In addition, only a portion of the organic layer 410 above the transmissive portion 322 may be selectively melted. Thus, only a portion of the organic layer 410 may form an organic agglomerate. The organic agglomerate may be deposited on the display substrate to thereby form an organic dot 401 (see FIGS. 2 and 3). Accordingly, the size and shape of the organic dot 401 may vary based on width and shape of the transmissive portion 322 and the light blocking portion 321.

The transmissive portion 322 may have a width ranging from about 2 μm to about 10 μm. The light blocking portion 321 may have a width ranging from about 2 μm to about 10 μm. When the transmissive portion 322 has a width ranging from about 2 μm to about 10 μm, an organic dot 401 having a diameter ranging from about 0.5 μm to about 5 μm may be formed. In addition, the light blocking portion 321 may have a height ranging from about 1 μm to about 10 μm. However, the widths and the heights of the transmissive portion 322 and the light blocking portion 321 may vary where necessary and are not limited to those described above. The transmissive portion 322 and the light blocking portion 321 may have the same width or may have different widths.

Figure 5:
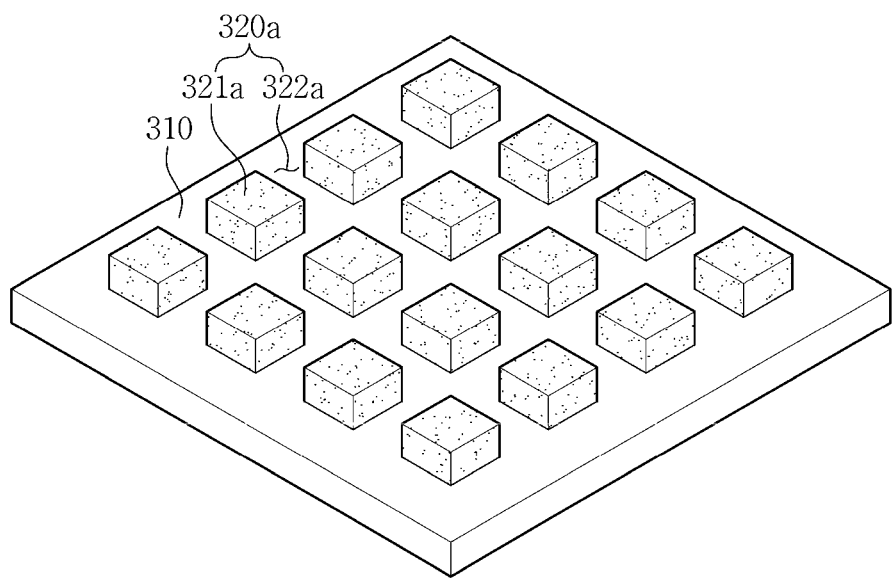
FIGS. 5, 6, and 7 are perspective views a light blocking pattern layer according to various exemplary embodiments.
Figure 6:
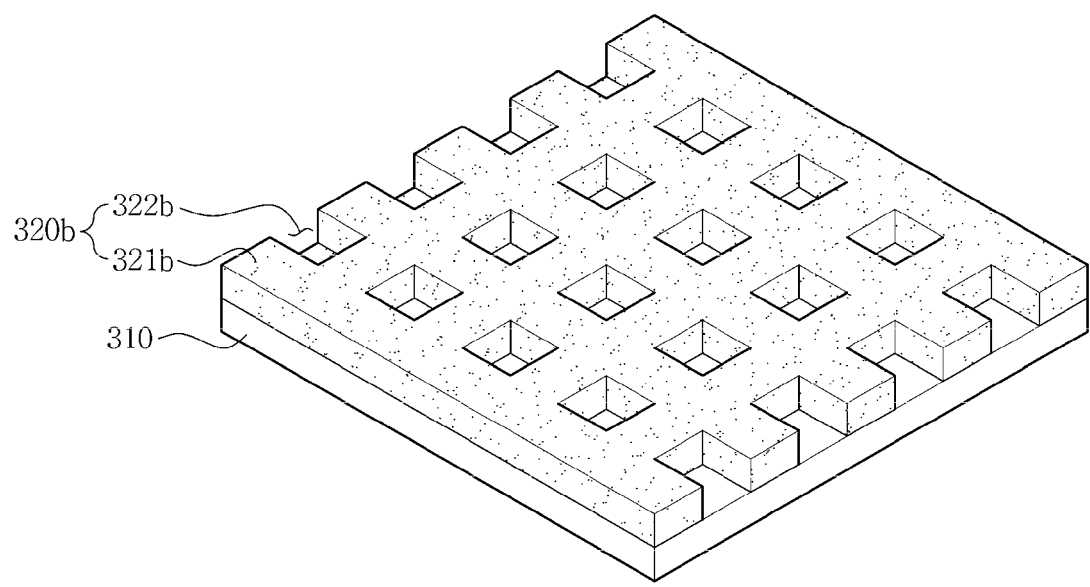
Figure 7:
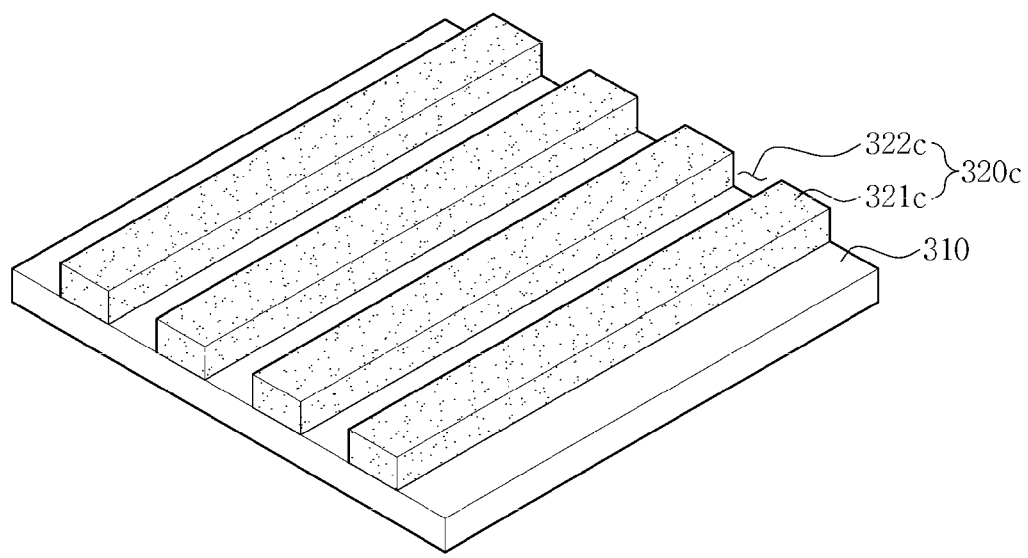

FIGS. 5, 6, and 7 are perspective views illustrating examples of the light blocking pattern layer 320.

The light blocking pattern layer 320a illustrated in FIG. 5 may include a light blocking portion 321a having an island shape on the base substrate 310. Here, a space among light blocking portions 321a may correspond to a transmissive portion 322a. Although, FIG. 5 illustrates the island-shaped light blocking portion 321a as polygonal (e.g., a cube or a rectangular box) in shape, the island-shaped light blocking portion 321a may be any island based shape. For example, but by no means limiting, the light blocking portion 321a may have a spherical or a cylindrical shape.

A light blocking pattern layer 320b illustrated in FIG. 6 may include a light blocking portion 321b having a lattice shape on the base substrate 310. Here, a space, having a polygonal shape (e.g., a cube or a rectangular box), defined among the light blocking portions 321b, may correspond to a transmissive portion 322b. However, the space may be any shape. For example, but by no means limiting, the space defined by the light blocking portions 321b may have a spherical or a cylindrical shape.

A light blocking pattern layer 320c illustrated in FIG. 7 may include a light blocking portion 321c having a linear shape on the base substrate 310. Herein, a space, having a rectangular groove shape, defined among the light blocking portions 321c may correspond to a transmissive portion 322c.

As mentioned above, the shapes of the transmissive portion 322 and the light blocking portion 321 are not limited to examples illustrated in FIGS. 5, 6, and 7, and the light blocking pattern layer 320 may be designed to have various shapes.

The thermal insulating layer 330 may be disposed on the light blocking pattern layer 320. The thermal insulating layer 330 may prevent heat generated in the light-heat conversion layer 340 above the transmissive portion 332 from being transmitted to an upper portion of the light blocking portion 321 through the light blocking portion 321. The thermal insulating layer 330 may also serve as a planarization layer to allow the light-heat conversion layer 340 to be stably disposed on the thermal insulating layer 330.

The thermal insulating layer 330 may include or may be formed of a transparent material having a low thermal conductivity. For example, the thermal insulating layer 330 may include or may be formed of at least one of silicon oxide ($SiO_x$), silicon nitride ($SiN_x$), and glass. The thermal insulating layer 330 is not limited to the materials listed above and may include any other suitable material.

The light-heat conversion layer 340 may be disposed on the thermal insulating layer 330. The light-heat conversion layer 340 may convert incident light to heat. The light-heat conversion layer 340 may include a light absorbing material. For example, the light-heat conversion layer 340 may include at least one of aluminum oxide, aluminum sulfide, carbon black, graphite, and an infrared dye. The light-heat conversion layer 340 may convert visible light or ultraviolet (UV) light to heat.

The low surface tension layer 350 may be disposed on the light-heat conversion layer 340. The low surface tension layer 350 may have a first surface tension that is considered low when compared other layers in the donor substrate 103. The first surface tension of the low surface tension layer 350 may be lower than a second surface tension of the organic layer 410 disposed on the low surface tension layer 350. Furthermore, the low surface tension layer 350 may have a first surface tension lower than a second surface tension of an organic material included in the organic layer 410. For example, an organic material used for the organic layer 410 may have a second surface tension of about 50 dyne per centimeter (dyn/cm) or more and the low surface tension layer 350 may have a first surface tension of about 30 dyne per centimeter (dyn/cm) or less. As another example, the low surface tension layer 350 may have a first surface tension ranging from about 5 dyne per centimeter (dyn/cm) to about 30 dyne per centimeter (dyn/cm).

The low surface tension layer 350 may include or may be formed of an organic material or a mixture of an organic material and an inorganic material. The low surface tension layer 350 may also include any suitable coating material. For example, the low surface tension layer 350 may include a surface coating of a polymer resin having a —$CF_x$ group (x may be an integer in a range of 1 to 3). More specifically, the low surface tension layer 350 may include at least one of polytetrafluoroethylene (PTFE) (more commonly known as Teflon™ from The Chemours Company), a fluorinated ethylene propylene copolymer (FEP), perfluoroalkoxyalkane (PFA), an ethylene-tetrafluoroethylene copolymer (ETFE), polychlorotrifluroroethylene (PCRFE), polyvinylidene fluoride (PVDF), ethylene-chlorotrifluoroethylene (ECTFE), and polychlorotrifluoroethylene (PCTFE). However, the surface coating of the low surface tension layer 350 may include any suitable material and is not limited to the materials listed above.

The organic layer 410 may be disposed on the low surface tension layer 350. The organic layer 410 may include an organic material having a relatively low evaporation point. For example, the organic layer 410 may include an organic material having an evaporation point at a temperature ranging from about 80° C. to about 430° C.

The organic material included in the organic layer 410 may be deposited to on the second electrode 213 to form the organic dot 401 (see FIGS. 2 and 3) according to an exemplary embodiment. The organic layer 410 may include or may be formed of the organic material forming the organic dot 401. In other words, the organic layer 410 may include at least one of tris(8-hydroxy-quinolinato) aluminum ($Alq_3$), 4,4'-bis(carbazol-9-yl)biphenyl (CBP), and tris (2-phenylpyridine)-iridium(III) ($Ir(ppy)_3$).

Figure 8:
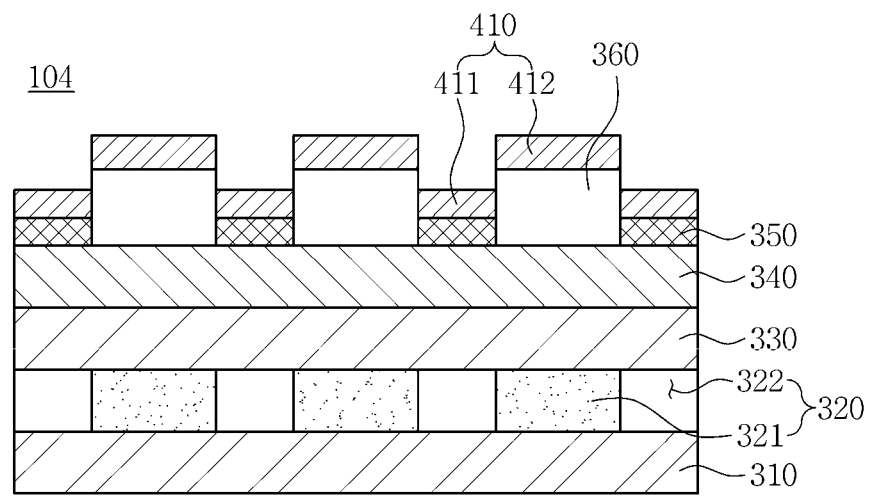
FIG. 8 is a cross-sectional view illustrating a donor substrate according to an to exemplary embodiment.

An exemplary embodiment will be described with reference to FIG. 8 below. FIG. 8 is a cross-sectional view illustrating a donor substrate 104 according to an exemplary embodiment. Hereinafter, in order to avoid repetition, detailed descriptions with regard to the configurations described above will be omitted for brevity. In other words, the differences between FIGS. 4 and 8 will be described below.

The donor substrate 104 of FIG. 8 may have the same configuration and elements as the donor substrate 103 of FIG. 4, except that the donor substrate 104 of FIG. 8 may include a partition wall 360 disposed on a light-heat conversion layer 340. The partition wall 360 may be disposed above and may correspond to a light blocking portion 321.

The partition wall 360 may include or may be formed of an insulating material and/or a thermal insulating material. For example, the partition wall may include at least one of a polymer resin and ceramic. The partition wall 360 may have a planar surface the same as that of the light blocking portion 321. For example, the partition wall 360 may have a planar shape of an island shape, a lattice shape, or a groove shape (see FIGS. 5, 6, and 7). However, exemplary embodiments are not limited to a particular shape of the partition wall 360. Thus, the partition wall 360 may be formed to have any suitable shape.

A low surface tension layer 350 may be disposed on a portion of the light-heat conversion layer 340 that does not have the partition wall 360. In order to avoid repetition, descriptions with regard to the low surface tension layer 350 will be omitted.

The partition wall 360 and the low surface tension layer 350 may have different heights. The partition wall 360 may be higher than or lower than the low surface tension layer 350. For example, the partition wall 360 illustrated in FIG. 8 is higher than the low surface tension layer 350.

An organic layer 410 may be disposed on the partition wall 360 and the low surface tension layer 350. Alternatively, the organic layer 410 may only be disposed on the low surface tension layer 350. In other words, the organic layer 410 is excluded from being disposed on or above the partition wall 360. As mask may be used to when disposing the organic layer 410 only on the low surface tension layer 350. In contrast, a mask may not be used when disposing the organic layer 410 above the partition wall 360 in addition to above the low surface tension layer 350. The organic layer 410 may be disposed or formed only on the low surface tension layer 350 or on both the partition wall 360 and the low surface tension layer 350 using a deposition or coating method.

A method of manufacturing an OLED display device according to an exemplary embodiment will be described with reference to FIGS. 9A, 9B, 9C, 9D, and 9E below.

FIGS. 9A, 9B, 9C, 9D, and 9E are process diagrams illustrating a method of manufacturing the OLED display device using the donor substrate 103 of FIG. 4.

Figure 9A:
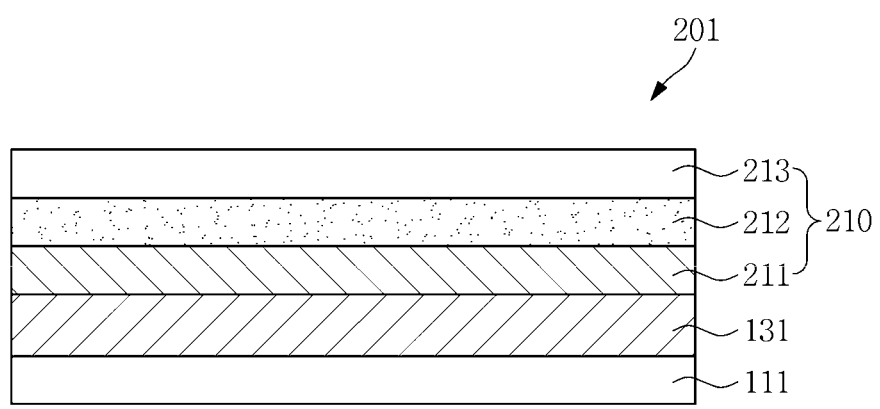
FIGS. 9A, 9B, 9C, 9D, and 9E are process diagrams illustrating a method of manufacturing an OLED display device using the donor substrate of FIG. 4.

Referring to FIG. 9A, the wiring unit 133 may be disposed on the first substrate 111. The first electrode 211, the organic light emitting layer 212, and the second electrode 213 also may be sequentially disposed on the first substrate 111 so that the display substrate 201 may be manufactured according to the OLED display device 101. In other words, the structure of the display substrate 201 is schematically illustrated in FIG. 9A as a precursor of the OLED display device 101 of FIG. 2.

Although not shown, a capping layer may be disposed on the second electrode 213. In such an exemplary embodiment, the display substrate 201 may be a precursor of the OLED display device 102, not the OLED display device 101. As such, a process of manufacturing the display substrate 201 may further include disposing or forming of the capping layer on the second electrode 213. In order to avoid repetition, descriptions with regard to the OLED display device 102 described above will be omitted.

Figure 9B:
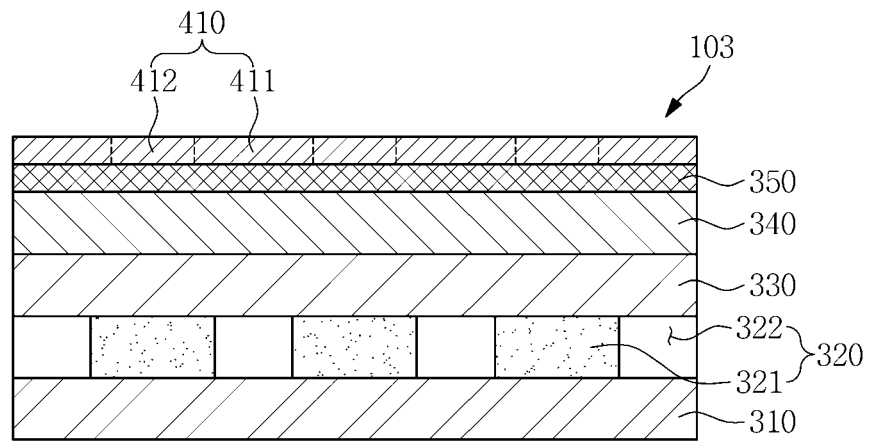

Referring to FIG. 9B, the light blocking pattern layer 320, the thermal insulating layer 330, the light-heat conversion layer 340, the low surface tension layer 350, and the organic layer 410 may be sequentially disposed on the base substrate 310 so that the donor substrate 103 may be manufactured.

Figure 9C:
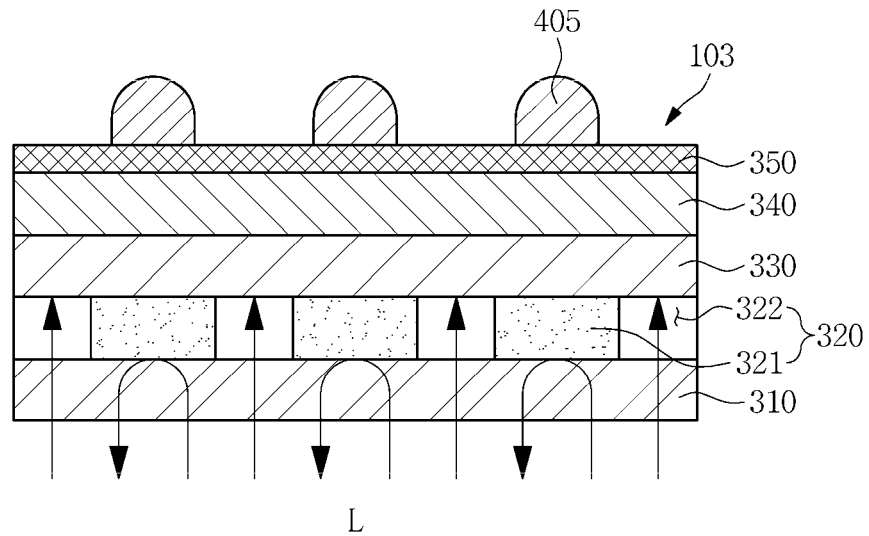

Referring to FIG. 9C, light L may be irradiated to the base substrate 310 of the donor substrate 103.

The light L incident to the base substrate 310 may be transmitted through the light blocking pattern layer 320 to be selectively irradiated to the light-heat conversion layer 340 through the thermal insulating layer 330. The light blocking pattern layer 320 may serve as a mask to allow the light L to be selectively irradiated to the light-heat conversion layer 340. The light blocking portion 321 of the light blocking pattern layer 320 may block light L, and the transmissive portion 322 may transmit light L. The light blocking portion 321 may reflect light L to prevent the light blocking portion 321 and the upper portion thereof from being heated.

To irradiate light L, a visible light lamp, a UV lamp and/or a laser may be used.

The light L transmitted through the transmissive portion 322 may be transmitted through the thermal insulating layer 330 and may be absorbed by the light-heat conversion layer 340 to be converted into heat. Thus, the light-heat conversion layer 340 may be selectively heated, and an organic layer 411 disposed on a heated portion of the light-heat conversion layer 340 may be melted (see FIGS. 9B and 9C).

In other words, the organic layer 411 disposed above and corresponding to the transmissive portion 322 may be melted to from an organic material in a fluid state. However, an organic layer 412 disposed above and corresponding to the light blocking portion 321 may be not melted.

The low surface tension layer 350 may have a first surface tension lower than a second surface tension of the organic material in the fluid state. Because the second surface tension of the organic material in the fluid state may be higher than the first surface tension of the low surface tension layer 350, the organic material in the fluid state may exhibit a natural agglomeration tendency.

In an exemplary embodiment, the organic layer 412 disposed above the light blocking portion 321, which is the unmelted portion of the organic layer 410, may serve as a core so that the organic material in the fluid state may be concentrated toward the unmelted portion of the organic layer 410. In other words, the organic layer 412, and an agglomerate (or multiple agglomerates) formed from the organic layer 411 together form an organic agglomerate 405. Such an organic agglomerate 405 may have a diameter ranging from about 0.5 μm to about 5 μm. The size of the organic agglomerate 405 may vary based on widths of the transmissive portion 322 and the light blocking portion 321.

Figure 9D:
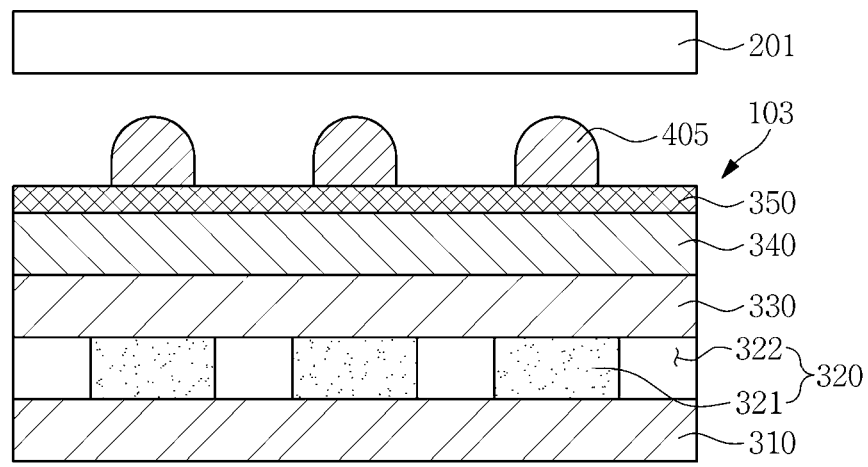

In reference to FIG. 9D, the display substrate 201 (i.e., a precursor for the OLED display device 101 or the OLED display device 102) may be disposed above the donor substrate 103. The display substrate 201 may be spaced apart from the donor substrate 103. In an exemplary embodiment, the display substrate 201 may be disposed to allow the second electrode 213 (see FIG. 2) of the display substrate 201 and the organic agglomerate 405 of the donor substrate 103 to face each other. In an alternate exemplary embodiment, the capping layer is disposed on the second electrode 213 of the display substrate 201 (see FIG. 3) and the display substrate 201 may be disposed to allow the capping layer and the organic agglomerate 405 of the donor substrate 103 to face each other.

Figure 9E:
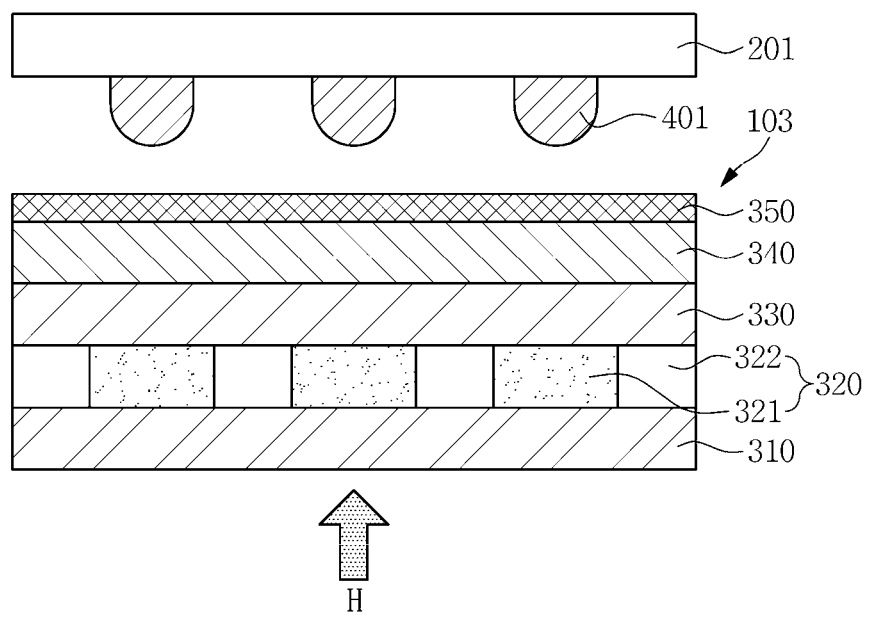

Referring to FIG. 9E, heat H may be applied to the donor substrate 103. The donor substrate 103 may be heated to the evaporation point of the organic agglomerate 405 or a temperature higher than the evaporation point of the organic agglomerate 405.

The organic material included in the organic layer 410 may have an evaporation point at a temperature ranging from about 80° C. to about 430° C. Thus, the donor substrate 103 may be heated to a temperature ranging from about 80° C. to about 450° C. to provide adequate heat to the organic material of the organic layer 410 for evaporation. In an exemplary embodiment, the donor substrate 103 may be heated to a temperature over 450° C. to ensure that the organic material of the organic layer evaporates.

A heater may be used to heat the donor substrate 103. When the donor substrate 103 is heated, the organic agglomerate 405 may be disposed on the display substrate 201 to form the organic dot 401. In an exemplary embodiment, the organic dot 401 is disposed on the second electrode 213 (see FIG. 2). In an alternate exemplary embodiment, the capping layer is previously disposed on the second electrode 213 and the organic dot 401 is disposed on the capping layer (see FIG. 3).

A method of manufacturing an OLED display device according to an exemplary embodiment will be described with reference to FIGS. 10A, 10B, 10C, and 10D below.

FIGS. 10A, 10B, 10C, and 10D are process diagrams illustrating a method of manufacturing the OLED display device using the donor substrate 104 of FIG. 8. The method of manufacturing the OLED display device illustrated in FIGS. 10A, 10B, 10C, and 10D may be the same as the method of manufacturing the OLED display device illustrated in FIGS. 9A, 9B, 9C, 9D, and 9E another exemplary embodiment, except for using the donor substrate 104 of FIG. 8.

Figure 10A:
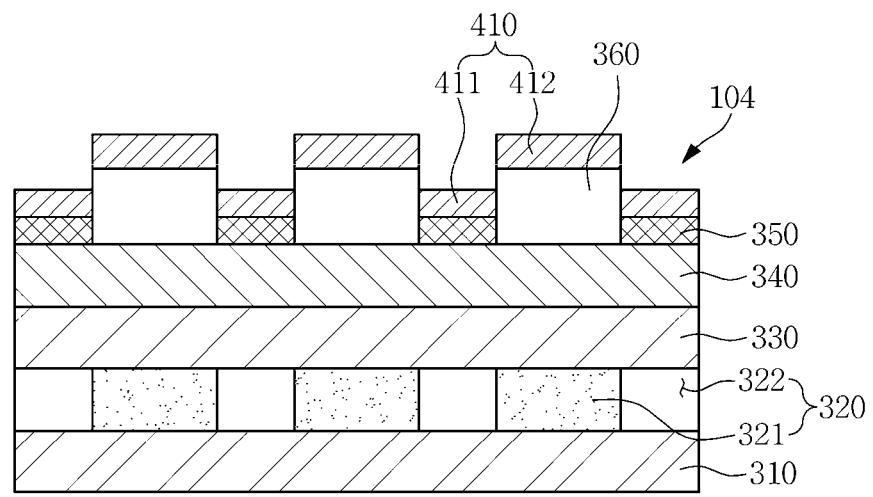
FIGS. 10A, 10B, 10C, and 10D are process diagrams illustrating a method of manufacturing an OLED display device using the donor substrate of FIG. 8.

Referring to FIG. 10A, the donor substrate 104 may include a partition wall 360 disposed on the light-heat conversion layer 340. The partition wall 360 may be disposed above and corresponding to the light blocking portion 321. The low surface tension layer 350 may be disposed on a portion of the light-heat conversion layer 340 that does not include the partition wall 360. The organic layer 410 may be disposed on the partition wall 360 and the low surface tension layer 350. Alternatively, the organic layer 410 may be only disposed on the low surface tension layer 350. In other words, the organic layer 411 of FIG. 10A is omitted and the organic layer 410 only includes the organic layer 411.

Figure 10B:
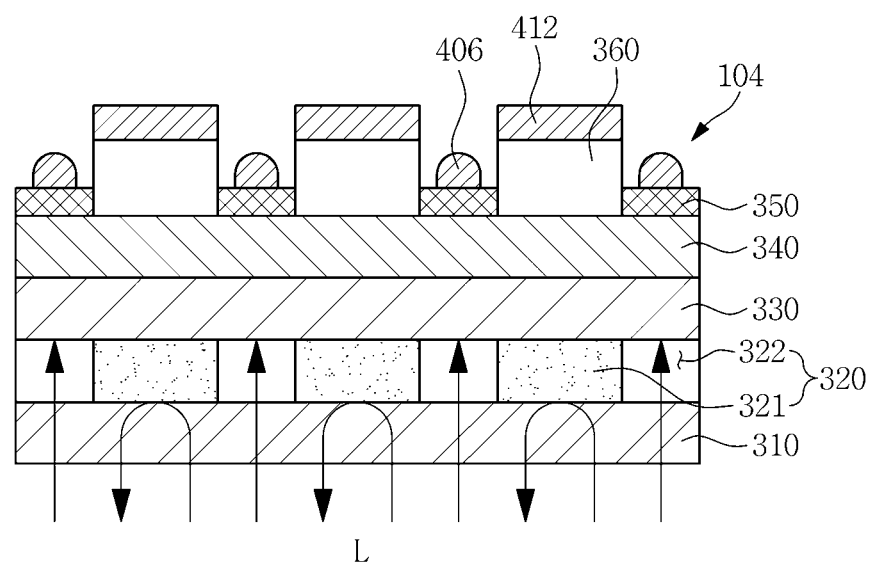

Referring to FIG. 10B, light L may be irradiated to the base substrate 310 of the donor substrate 104.

The light L incident to the base substrate 310 may be absorbed by a portion of the light-heat conversion layer 340 disposed above and corresponding to the transmissive portion 322 such that the light L is converted into heat. Thus, an organic layer 411 disposed above the transmissive portion 322 may be melted and the melted organic material may agglomerate to form an organic agglomerate 406 above the transmissive portion 322. However, an organic layer 412 disposed above the light blocking portion 321 may not melt.

Figure 10C:
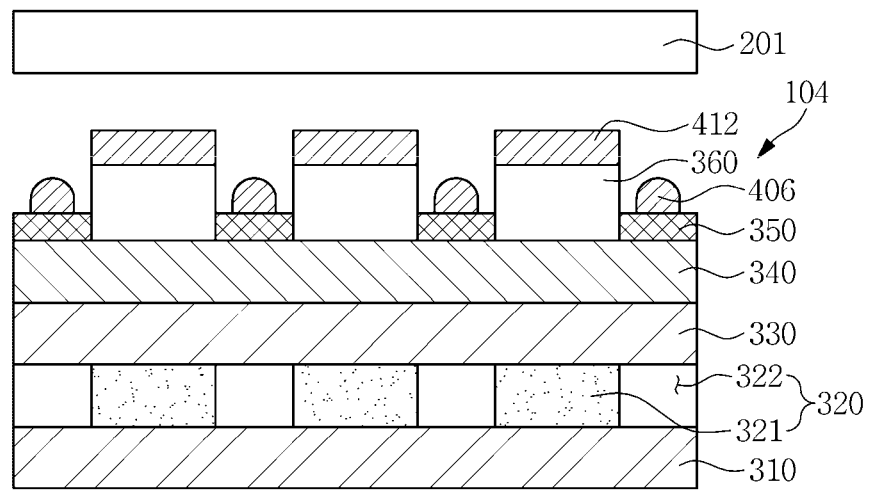

Referring to FIG. 10C, the display substrate 201 may be disposed above the donor substrate 104. The display substrate 201 may be spaced apart from the donor substrate 104. In an exemplary embodiment, the display substrate 201 may be disposed to allow the second electrode 213 (see FIG. 2) of the display substrate 201 and the organic agglomerate 406 of the donor substrate 104 to face each other. In an alternate exemplary embodiment, the capping layer is disposed on the second electrode 213 of the display substrate 201 (see FIG. 3) and the display substrate 201 may be disposed to allow the capping layer and the organic agglomerate 405 of the donor substrate 104 to face each other.

Figure 10D:
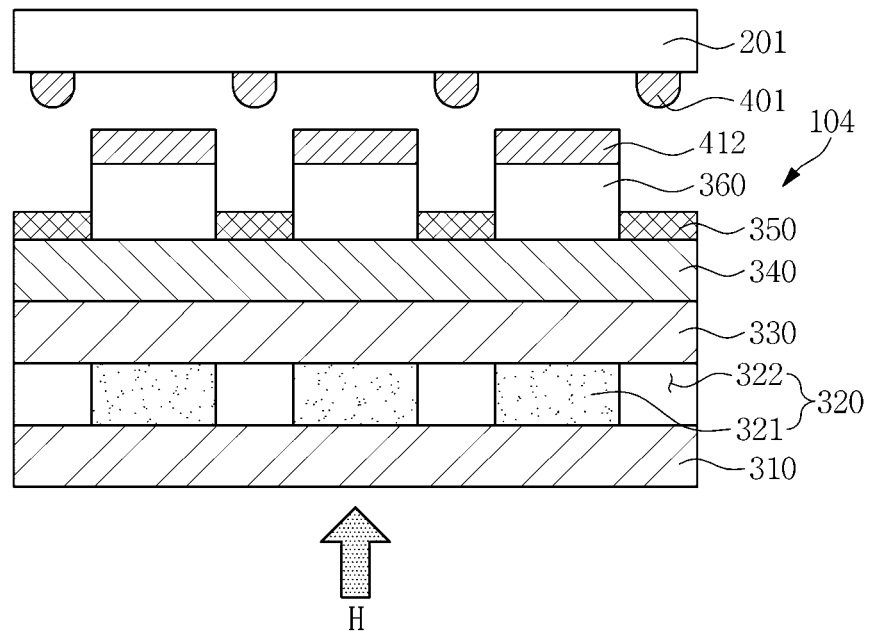

Referring to FIG. 10D, heat H may be applied to the donor substrate 104. When the donor substrate 104 is heated, the organic agglomerate 406 may be disposed on the display substrate 201 to form the organic dot 401. In an exemplary embodiment, the organic dot 401 is disposed on the second electrode 213 (see FIG. 2). In an alternate exemplary embodiment, the capping layer is previously disposed on the second electrode 213 and the organic dot 401 is disposed on the capping layer (see FIG. 3).

As set forth above, through the use of the donor substrate according to exemplary embodiments, the organic dot may be disposed on the second electrode or the capping layer of the OLED display device. The organic dot may serve as a light scattering particle to improve light emission efficiency of the OLED display device.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode (OLED) display device, comprising:

a first substrate;

a first electrode disposed on the first substrate;

an organic light emitting layer disposed on the first electrode;

a second electrode disposed on the organic light emitting layer;

a plurality of organic dots disposed on the second electrode;

a second substrate disposed on the plurality of organic dots and the second electrode; and an inert gas layer disposed directly between the plurality of organic dots and the second substrate, wherein all of the plurality of organic dots are disposed on a substantially same layer.

2. The OLED display device of claim 1, wherein each of the plurality of organic dots has a diameter ranging from about 0.5 μm to about 5 μm.

3. The OLED display device of claim 1, wherein each of the plurality of organic dots comprises an organic material having an evaporation point at a temperature ranging from about 80° C. to about 430° C.

4. The OLED display device of claim 1, wherein the plurality of organic dots have a refractive index ranging from about 1.3 to about 2.6.

5. The OLED display device of claim 1, wherein:
the plurality of organic dots have a first refractive index,
the second electrode has a second refractive index, and
a difference between the first refractive index and the second refractive index is about 0.1 or more.

6. The OLED display device of claim 1, wherein the plurality of organic dots comprise at least one of tris(8-hydroxy-quinolinato) aluminum (Alq3), 4,4'-bis(carbazol-9-yl)biphenyl (CBP), and tris(2-phenylpyridine)-iridium(III) (Ir(ppy)3).

7. The OLED display device of claim 1, further comprising a capping layer disposed on the second electrode, wherein the plurality of organic dots are disposed on the capping layer.

8. The OLED display device of claim 7, wherein the plurality of organic dots have a first refractive index, the capping layer has a third refractive index, and a difference between the first refractive index and the third refractive index is about 0.1 or more.

9. The OLED display device of claim 1, further comprising a second substrate disposed on the plurality of organic dots.

10. A donor substrate, comprising:
a base substrate;
a light blocking pattern layer disposed on the base substrate;
a thermal insulating layer disposed on the light blocking pattern layer;
a light-heat conversion layer disposed on the thermal insulating layer;
a low surface tension layer disposed on the light-heat conversion layer; and
an organic layer disposed on the low surface tension layer,
wherein the light blocking pattern layer comprises a transmissive portion and a light blocking portion adjacent to the transmissive portion, and wherein the low surface tension layer has a first surface tension that is lower than a second surface tension of the organic layer.

11. The donor substrate of claim 10, wherein the light blocking portion comprises a reflective layer.

12. The donor substrate of claim 10, wherein the transmissive portion has a width ranging from about 2 μm to about 10 μm.

13. The donor substrate of claim 10, wherein the first surface tension of the low surface tension layer ranges from about 5 dyne per centimeter to about 30 dyne per centimeter.

14. The donor substrate of claim 10, wherein the low surface tension layer comprises at least one of polytetrafluoroethylene (PTFE), a fluorinated ethylene propylene copolymer (FEP), perfluoroalkoxyalkane (PFA), an ethylene-tetrafluoroethylene copolymer (ETFE), polychlorotrifluoroethylene (PCRFE), polyvinylidene fluoride (PVDF), ethylene-chlorotrifluoroethylene (ECTFE), and polychlorotrifluoroethylene (PCTFE).

15. The donor substrate of claim 10, wherein the organic layer comprises an organic material having an evaporation point at a temperature ranging from 80° C. to 430° C.

16. The donor substrate of claim 10, wherein the organic layer comprises at least one of tris(8-hydroxy-quinolinato) aluminum (Alq3), 4,4'-bis(carbazol-9-yl)biphenyl (CBP), and tris(2-phenylpyridine)-iridium(III) (Ir(ppy)3).

17. A method of manufacturing an organic light emitting diode (OLED) display device, the method comprising:
preparing a display substrate by disposing a first electrode, an organic light emitting layer, and a second electrode on a first substrate;
preparing a donor substrate by disposing a reflective pattern, a thermal insulating layer, a light-heat conversion layer, a low surface tension layer, and an organic layer on a base substrate;
forming an organic agglomerate, from the organic layer, on the low surface tension layer by irradiating light to the donor substrate;
disposing the display substrate above the donor substrate such that the second electrode of the display substrate faces the organic layer of the donor substrate and such that the display substrate is spaced apart from the donor substrate; and
forming an organic dot by heating the donor substrate such that the organic agglomerate is disposed on the second electrode of the display substrate,
wherein the low surface tension layer has a first surface tension lower that is lower than a second surface tension of the organic layer.

18. The method of claim 17, wherein the preparing of the display substrate further comprises disposing a capping layer on the second electrode, and
the forming of the organic dot comprises forming the organic dot on the capping layer.

19. The method of claim 17, wherein the organic agglomerate has a diameter ranging from 0.5 μm to 5 μm.

20. The method of claim 17, wherein the forming of the organic dot comprises heating the donor substrate to a temperature ranging from about 80° C. to about 450° C.

* * * * *